United States Patent
Yamane et al.

(10) Patent No.: US 11,238,191 B2
(45) Date of Patent: Feb. 1, 2022

(54) SIMULATION PROGRAM, SIMULATION METHOD, AND SIMULATION APPARATUS

(71) Applicant: FUJITSU LIMITED, Kawasaki (JP)

(72) Inventors: Shohei Yamane, Kawasaki (JP); Hiroaki Yamada, Kawasaki (JP); Kotaro Ohori, Sumida (JP); Hirokazu Anai, Hachioji (JP); Shingo Takahashi, Shinjuku (JP)

(73) Assignee: FUJITSU LIMITED, Kawasaki (JP)

( * ) Notice: Subject to any disclaimer, the term of this patent is extended or adjusted under 35 U.S.C. 154(b) by 308 days.

(21) Appl. No.: 16/433,065

(22) Filed: Jun. 6, 2019

(65) Prior Publication Data
US 2019/0377842 A1 Dec. 12, 2019

(30) Foreign Application Priority Data
Jun. 8, 2018 (JP) .............................. JP2018-110735

(51) Int. Cl.
G06F 30/20 (2020.01)
G06Q 10/04 (2012.01)
G06Q 50/10 (2012.01)

(52) U.S. Cl.
CPC ........... *G06F 30/20* (2020.01); *G06Q 10/047* (2013.01); *G06Q 50/10* (2013.01)

(58) Field of Classification Search
CPC ....... G06F 30/20; G06Q 50/10; G06Q 10/047
See application file for complete search history.

(56) References Cited

U.S. PATENT DOCUMENTS

| | | | | |
|---|---|---|---|---|
| 7,117,504 | B2* | 10/2006 | Smith | G06F 8/20 719/328 |
| 7,644,414 | B2* | 1/2010 | Smith | G06F 8/20 719/328 |
| 2018/0173828 | A1* | 6/2018 | Ohori | G06Q 50/10 |
| 2018/0208477 | A1* | 7/2018 | Fulton | C01F 7/20 |
| 2019/0228354 | A1* | 7/2019 | Ohori | G06Q 10/047 |

FOREIGN PATENT DOCUMENTS

| | | |
|---|---|---|
| JP | 2017-224201 | 12/2017 |
| WO | 2017/029698 | 2/2017 |

OTHER PUBLICATIONS

Alessandro Pluchino et al., "Agent-Based Simulation of Pedestrian Behaviour in Closed Spaces: A Museum Case Study", Journal of Artificial Societies and Social Simulation, vol. 17, No. 1, Feb. 28, 2013, XP055606945. Cited in EESR for corresponding European Patent Application No. 19177483.5.
EESR—Extended European Search Report for corresponding European Patent Application No. 19177483.5 dated Jul. 26, 2019.
European Office Action dated Jul. 6, 2021 for corresponding European Patent Application No. 19177483.5, 5 pages.

* cited by examiner

*Primary Examiner* — Thai Q Phan
(74) *Attorney, Agent, or Firm* — Fujitsu Patent Center

(57) ABSTRACT

A simulation method is performed by a computer by using an agent disposed in a virtual space. The method includes: controlling the agent so that the agent behaves in the virtual space under influence of each of a plurality of signs disposed in the virtual space; and determining the influence of each of the plurality of signs on the agent in accordance with an attribute relating to a display mode of the sign and an attribute of the agent.

12 Claims, 15 Drawing Sheets

FIG. 3

| SIGN NUMBER | LOCATION | TRANSMISSION RATE | DISTANCE | ANGLE | VISUAL RECOGNITION TIME | DISPLAY ATTRIBUTES | | | | AREA INFORMATION | FACILITY INFORMATION | GUIDANCE INFORMATION | THE DEGREE OF DIFFICULTY IN MEMORIZING |
|---|---|---|---|---|---|---|---|---|---|---|---|---|---|
| | | | | | | $x_1$ | $x_2$ | $x_3$ | ... | | | | |
| 1 | (20,20,1) | A | 10 | $2/3\pi$ | 3 | 2 | 1 | 2 | ... | restaurant | — | [2] | 1.0 |
| 2 | (20,20,1) | C | 4 | $2/3\pi$ | 15 | 1 | 1.5 | 1 | ... | exchange | 4,8,22,25 | [44,46,48] | 0.5 |
| .. | .. | .. | .. | .. | .. | .. | .. | .. | ... | .. | .. | .. | .. |
| 20 | (250,80,2) | C | 4 | $2/3\pi$ | 15 | 1 | 2 | 2 | ... | shop | 3,5,11,14,18 | [88,92,96] | 0.5 |

| THE OCCURRENCE PROBABILITY OF PEDESTRIANS |
|---|
| 0.8 |

13

| TYPE OF PEDESTRIAN | OCCURRENCE RATE | VISUAL RECOGNITION DISTANCE | VIEWING ANGLE | DEGREE OF INFLUENCE | | | | MEMORY HOLDING TIME | OBJECT CATEGORY SET | USEFULNESS VALUE (FACILITY 1) | ... | USEFULNESS VALUE (FACILITY 30) |
| | | | | β1 | β2 | β3 | ... | | | | | |
|---|---|---|---|---|---|---|---|---|---|---|---|---|
| 1 | 0.1 | 10 | 2/3 π | 3 | 0 | −1 | ... | 10 | 1,3,6,8 | 1.00 | ... | 2.12 |
| 2 | 0.1 | 10 | 2/3 π | 1 | 3 | 1 | ... | 12 | 2,3,6,7 | 3.14 | ... | 2.33 |
| ... | ... | ... | ... | ... | ... | ... | ... | ... | ... | ... | ... | ... |
| 10 | 0.1 | 10 | 2/3 π | 2 | 1 | 2 | ... | 9 | 1,3,4,5 | 4.11 | ... | 0 |

FIG. 11

(ATTRIBUTE VALUES)

| | agentA | agentB | agentC |
|---|---|---|---|
| $\beta 1$ | 3 | 1 | 2 |
| $\beta 2$ | 0 | 3 | 1 |
| $\beta 3$ | -1 | 1 | 2 |

(INFORMATION OBTAINABLE SIGNS OF EACH AGENT)

| | agentA | agentB | agentC |
|---|---|---|---|
| sign1 | ○ | ○ | × |
| sign2 | × | × | ○ |
| sign3 | × | × | ○ |

SIMULATION PROGRAM, SIMULATION METHOD, AND SIMULATION APPARATUS

CROSS-REFERENCE TO RELATED APPLICATION

This application is based upon and claims the benefit of priority of the prior Japanese Patent Application No. 2018-110735, filed on Jun. 8, 2018, the entire contents of which are incorporated herein by reference.

FIELD

The embodiments discussed herein are related to a simulation program, a simulation method, and a simulation apparatus.

BACKGROUND

To date, a people flow simulation has been used for the study of a sign system plan involved in the disposition of a mark (sign) that exhibits various kinds of guidance, a guide, and the like (hereinafter referred to as a sign as a whole) in a shopping mall, an airport, and the like.

In the people flow simulation, a sign in accordance with a sign system plan and pedestrian agents (hereinafter referred to as agents) that simulate pedestrians are disposed in a virtual space corresponding to a shopping mall, an airport, and the like. The behaviors of the agents are simulated based on the information obtained (recognized) by the sign disposed in the virtual space so that flows of pedestrians are simulated in the sign system plan. The related-art techniques are disclosed in International Publication Pamphlet No. WO 2017/29698 and Japanese Laid-open Patent Publication No. 2017-224201.

However, the related art described above is simply for the purpose of evaluating the disposition of a sign in a virtual space, and the influence of an individual sign on an agent is regarded as uniform regardless of the fact that there is a difference for each agent. Accordingly, there is a problem in that it is difficult to evaluate the influence of different display modes of an individual sign on an agent.

According to an aspect, it is desirable to provide a simulation program, a simulation method, and a simulation apparatus that enable the evaluation of the display modes of a sign.

SUMMARY

According to an aspect of the embodiments, a simulation method is performed by a computer by using an agent disposed in a virtual space. The method includes: controlling the agent so that the agent behaves in the virtual space under influence of each of a plurality of signs disposed in the virtual space; and determining the influence of each of the plurality of signs on the agent in accordance with an attribute relating to a display mode of the sign and an attribute of the agent The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is an explanatory diagram of a sign system plan;

FIG. 4 is an explanatory diagram of pedestrian information;

FIG. 11 is an explanatory diagram of an example of the attribute values of the agents and information obtainable signs by the agents;

DESCRIPTION OF EMBODIMENTS

In the following, a description will be given of a simulation program, a simulation method, and a simulation apparatus according to an embodiment with reference to the drawings. In the embodiments, a same reference symbol is given to a component having the same function, and a duplicated description will be omitted. The simulation program, the simulation method, and the simulation apparatus, which are described in the following embodiments, are only examples and do not limit the embodiments. Each of the following embodiments may be suitably combined within a range that does not cause a conflict.

Figure 1:
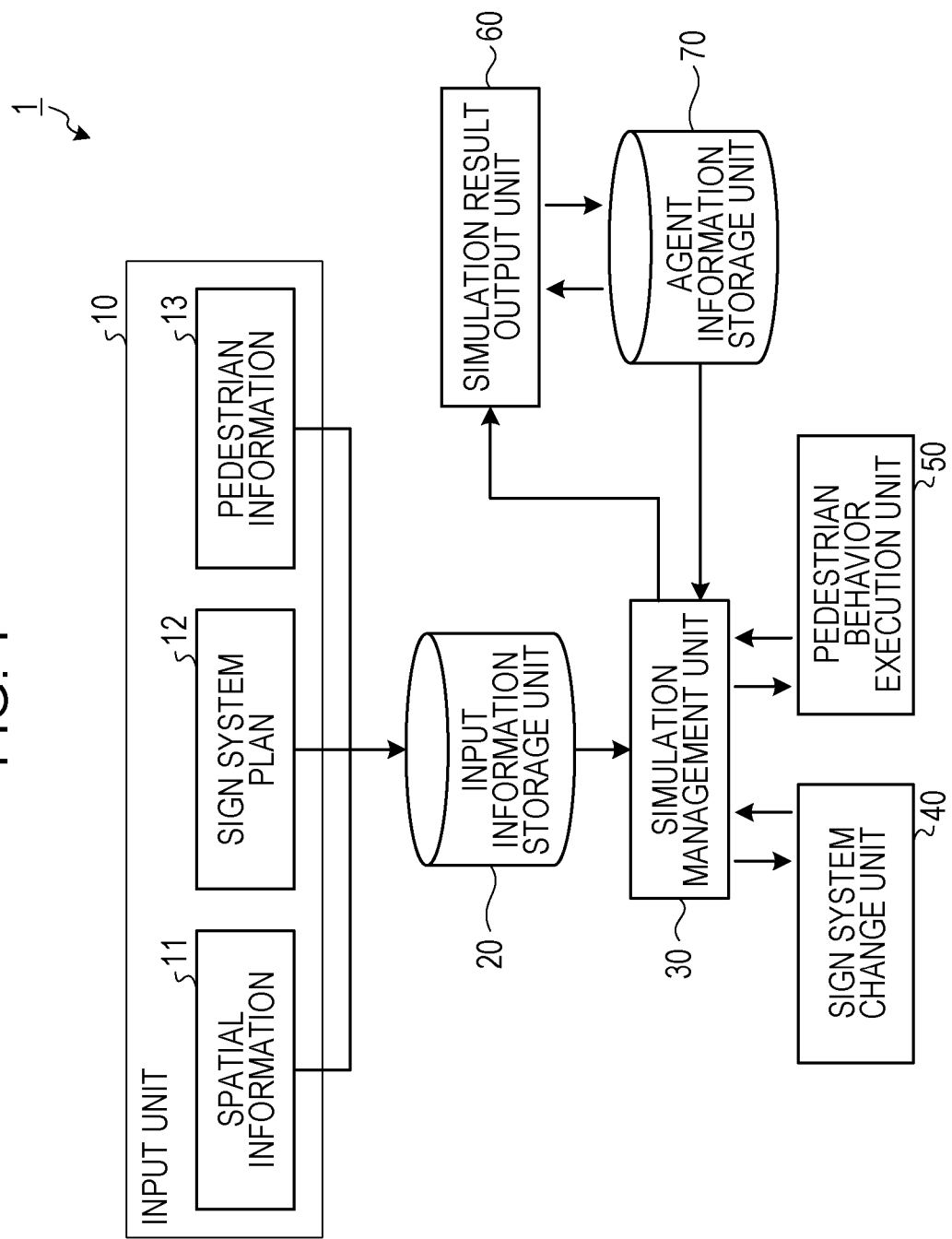
FIG. 1 is a block diagram illustrating an example of the configuration of a simulation apparatus according to an embodiment.

FIG. 1 is a block diagram illustrating an example of the configuration of a simulation apparatus 1 according to an embodiment. The simulation apparatus 1 illustrated in FIG. 1 is an information processing apparatus, for example, a personal computer (PC), or the like. The simulation apparatus 1 simulates the behaviors of agents in a virtual space based on input information and perform people flow simulation that simulates the flow of pedestrians. As illustrated in FIG. 1, the simulation apparatus 1 includes an input unit 10, an input information storage unit 20, a simulation management unit 30, a sign system change unit 40, a pedestrian behavior execution unit 50, a simulation result output unit 60, and a simulation result output unit 60.

The input unit 10 receives input information related to simulation, such as spatial information 11, a sign system plan 12, pedestrian information 13, and the like from an input device, for example, a mouse, a keyboard, or the like.

The input information storage unit 20 stores input information, such as the spatial information 11, the sign system plan 12, the pedestrian information 13, and the like that are input from the input unit 10 in a storage device, such as a random access memory (RAM), a hard disk drive (HDD), or the like.

The spatial information 11 is information indicating the structure of a virtual space related to simulation, such as a shopping mall, an airport, or the like. Specifically, the spatial information 11 includes the description of a cell environment about the virtual spaces (the dimensions, the number of floors, the locations of walls, hallways, facilities, and the like), in which an agent in the simulation moves about and a network environment about the connections of the nodes (hallways, facilities, and the like) in the virtual spaces. A user inputs the spatial information 11 of a virtual space to be studied for simulation into the simulation apparatus 1.

Figure 2:
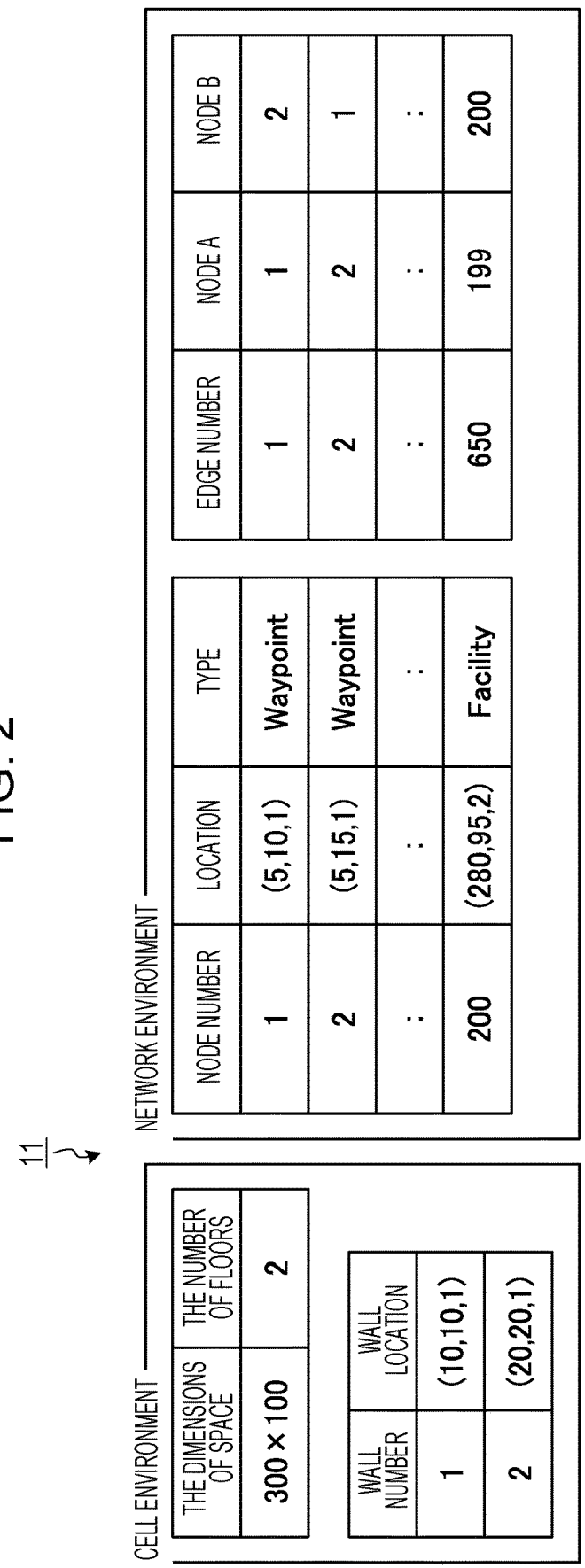
FIG. 2 is an explanatory diagram of spatial information.

FIG. 2 is an explanatory diagram of spatial information 11. As illustrated in FIG. 2, the spatial information 11 includes the description of a cell environment, such as the dimensions of a virtual space, the number of floors, a wall number indicating a cell (wall) to which an agent is impossible to enter, the location of a wall, and the like. The spatial information 11 includes the description of a network environment, such as the coordinates of a node, the type of a node, such as a walking target (waypoint), a facility, or the like for each node number indicating a node. The network environment includes the description of an edge number and node numbers indicating the nodes that are connected with each other for each passable edge between nodes.

A sign system plan 12 is information indicating the disposition of a sign that exhibits various kinds of guidance in a shopping mall, an airport, or the like. Specifically, the sign system plan 12 includes the description of attributes (location, transmission rate, distance, angle, visual recognition time, and display attribute) that characterize each sign and information (area information, facility information, guidance information, and the difficulty degree in memorizing) that each sign causes the agent to receive (recognize). The user inputs a sign system plan 12 to be studied for simulation in the simulation apparatus 1.

FIG. 3 is an explanatory diagram of a sign system plan 12. As illustrated in FIG. 3, a sign system plan 12 includes the description of attributes (location, transmission rate, distance, angle, visual recognition time, and display attribute) that characterize each sign for each sign number that identifies a sign.

The item of "location" is the set location of a sign in a virtual space. The item of "transmission rate" is a value (for example, a three-stage evaluation value from A to C) that indicates the transmission rate to an agent. The item of "distance" is a value indicating the distance in the virtual space, which enables an agent to recognize a sign. The item of "angle" is a value that enables an agent to recognize a sign. The item of "visual recognition time" is a value indicating time that takes for an agent to recognize the contents of a sign.

The item of "display attribute" is a numeric value produced by numerically expressing the display mode of a sign from various aspects, such as the size of character, information quantity, the presence or absence of drawings, and the like. As an example, x1 in the display attribute indicates the size of a character in a sign by a numeric value. A value of x1 becomes higher, for example, as the character size becomes large. A value of x2 indicates the information quantity included in a sign by a numeric value. A value of x2 indicates, for example, the number of sentences included in a sign and the number of characters by a numeric value. A value of x3 indicates whether or not a sign includes a drawing by a numeric value. A value of x3 is, for example, 0 in the case of not including a drawing and is a value in accordance with the size of the drawing in the case of including a drawing.

For the attributes that characterize each sign in the sign system plan 12, values that are evaluated based on the size of each sign to be planned to install and the display mode, and the like are input. For example, for a sign that is a large mark and includes small contents (for example, detailed guidance of a facility is omitted and the guidance of the area around is given), high values are set in the transmission rate and the distance, and a low value is set in the visual recognition time. For a sign that has the same size and large contents (for example, including a detailed guidance of a facility), low values are set in the transmission rate and the distance, and a high value is set in the visual recognition time.

For a sign having the display mode that enables transmission of detailed contents by increasing characters having a small size and removing diagrams, x1 is set to a relatively low value, such as 1 among 1 to 3, or the like, x2 is set to a relatively high value, such as 3 among 1 to 3, and x3 is set to 0. For a sign having the display mode in which the character size is large, and the number of characters is small, and which includes diagrams so as to enable transmission of an overview in an easy-to-understand manner, x1 is set to a relatively high value, such as 3, or the like, x2 is set to a relatively low value, such as 1, or the like, and x3 is set to a value in accordance with the size of the drawing, such as one or more. In this manner, by suitably setting the display attributes, it is possible to set the display mode of each sign.

The sign system plan 12 includes the description of information (area information, facility information, guidance information, the degree of difficulty in memorizing) related to recognition by an agent for each sign number identifying a sign.

The item of "area information" is information on an area that the agent is caused to receive (recognize), and includes, for example, a restaurant, a currency exchange, a shop, or the like. The item of "facility information" is information on a facility that the agent is caused to receive (recognize), and includes, for example, a number indicating the facility, or the like. The item of "guidance information" is information for guiding the agent to the location of an area indicated by the area information or a facility indicated by the facility information. For example, "guidance information" may be information indicating the direction from the location of the sign to the area or the facility, the route, or the like by a node number or an edge number in the virtual space, or the like. The item of "the difficulty degree in memorizing" is a value indicating the unforgettable degree for the agent who recognized the guidance information to forget the recognized guidance information (hereinafter also referred to as recognition information). For example, "the difficulty degree in memorizing" indicates that the higher the value the more difficult for the agent to forget the recognition information.

For the information related to the recognition of each sign in the sign system plan 12, an evaluated value is input based on the contents of each sign planned to be installed, or the like. For example, a sign (the guidance of a facility is omitted) that has the sign number of "1" and guides an area includes the description of a predetermined value in the area information, the guidance information, and the difficulty degree in memorizing, and NULL data ("-" in the example illustrated in FIG. 3) in the facility information. The sign that has the sign number of "2" and guides not only an area but also a facility includes the description of a predetermined value in the area information, the facility information, the guidance information, and the difficulty degree in memorizing. In this manner, the contents of guidance in a sign may have a hierarchy, such as a sign for guiding an area, a sign for guiding a facility with an area, or the like.

The contents of a sign that guides an area without the guidance of a facility is simpler than the contents that guides a facility with an area. It is possible to evaluate such simple guidance contents as the contents unforgettable for a pedestrian. Accordingly, the difficulty degree in memorizing is set such that a sign having the simpler guidance contents is given the higher value. For example, a sign that has the sign number of "1" and that guides an area is given a higher value in the difficulty degree in memorizing than a sign that has the sign number of "2" and that guides not only an area, but also a facility.

The pedestrian information 13 is information indicating an agent in the virtual space. Specifically, the pedestrian information 13 includes the occurrence probability of agents at an appearance point corresponding to an exit and an entrance in the virtual space, or the like and information on the type of an agent. The type of an agent includes, for example, a category by gender, such as male or female, and a category by age, such as child (infant, elementary school student, junior high school student, and high school student), adult (ages 20 to 40, ages of 40 to 60, and ages 60 or over), or the like. The user inputs the pedestrian information 13 on pedestrians to be studied for simulation in the simulation apparatus 1.

FIG. 4 is an explanatory diagram of the pedestrian information 13. As illustrated in FIG. 4, the pedestrian information 13 includes the description of the occurrence probability of agents and the characteristics of an agent that occurs for each number indicating a pedestrian type. The characteristics of agent include "occurrence rate", "visual recognition distance", "viewing angle", "degree of influence", "memory holding time", "object category", "usefulness value (facility 1) . . . (facility 30)", and the like.

The item of "occurrence rate" indicates the rate of occurrence of each agent. The items of "visual recognition distance" and "viewing angle" indicates the distance and the angle that each agent is capable of viewing, respectively, in the virtual space. The item of "memory holding time" indicates a time period during which each agent remembers the recognized information.

The item of "degree of influence" indicates the degree of influence on each agent with respect to each of the display modes (the size of character, information quantity, the presence or absence of drawings, and the like) of a sign. In other words, the degree of influence may refer to an index that indicates the preference by each agent to the display mode of a sign. It is also possible to interpret the degree of influence as an index that indicates which display mode of a sign is preferentially selected by each agent.

As an example, in the degree of influence, $\beta 1$ indicates the degree of influence on the agent with respect to the size of character of a sign by a numeric value. For example, the larger the size of character, the more easily an agent is attracted, and the like, and thus the higher value $\beta 1$ becomes as the degree of influence with respect to the size of character becomes the larger.

In the degree of influence, $\beta 2$ indicates the degree of influence on the agent with respect to the information quantity by a numeric value. For example, the larger the information quantity of a sign, the more easily an agent is attracted, and the like, and thus the higher value $\beta 2$ becomes as the degree of influence with respect to the information quantity becomes the larger.

In the degree of influence, $\beta 3$ indicates the degree of influence on the agent with respect to a drawing by a numeric value. For example, if a drawing is included, the more easily an agent is attracted, and the like, and thus the higher value $\beta 3$ becomes as the degree of influence with respect to a drawing becomes the larger.

The degree of influence ($\beta 1$ to $\beta 3$) on each agent with reference to each of the display modes of a sign may be set to 0 in the case where there is no influence particularly, may be set to a positive value in the case where there is affirmative influence, and may be set to a negative value in the case where there is negative influence. For example, for an agent corresponding to a pedestrian who likes a large information quantity, $\beta 2$ may be set to a positive value, and may be set to 3 among 1 to 3 in accordance with the degree of preference. On the contrary, for an agent corresponding to a pedestrian who dislikes a large information quantity, $\beta 2$ may be set to a negative value, and may be set to −3 among −1 to −3 in accordance with the degree of dislike.

The item of "object category" indicates values indicating the objects (for example, meal, shopping, and the like) of the behavior of each agent in order of priority. The items of "usefulness value (facility 1) . . . (facility 30)" indicate the usefulness of each facility for each agent by values respectively.

For the contents of the pedestrian information 13, values are input on the assumption of the pedestrians who visits a virtual space related to the simulation of a shopping mall, an airport, or the like. For example, in the case where there are a large number of uses by adults (ages 20 to 40 and ages 40 to 60), and there are few uses by children (infants, elementary school students, junior high school students, and high school students), the occurrence rate of a pedestrian type corresponding to an adult is set to high, and the occurrence rate of the pedestrian type corresponding to a child is set to low. In the same manner, regarding the preference of a pedestrian with respect to the display mode of a sign, the degree of influence is set in accordance with a pedestrian, such as an adult, a child, or the like.

The simulation management unit 30 manages simulation processing of the behavior of an agent in the virtual space that is performed by the pedestrian behavior execution unit 50 based on the input information (spatial information 11, sign system plan 12 and pedestrian information 13) stored in the input information storage unit 20. Specifically, the simulation management unit 30 reads the input information stored in the input information storage unit 20 and the sequential simulation result (the location information of the agent and the recognition information of the agent) of the behavior of the agent stored in the agent information storage unit 70, and outputs the information to the pedestrian behavior execution unit 50.

In the simulation management unit 30, the influence of each of a plurality of signs in the virtual space on individual agents is determined in accordance with a plurality of the display attributes related to the display mode of a sign and the attributes (the degree of influence) of an agent (the details will be described later).

The simulation management unit 30 puts a limit on the recognition information of the agent in accordance with the progress of the simulation in the pedestrian behavior execution unit 50 and outputs the recognition information of the agent to the pedestrian behavior execution unit 50 (the details will be described later). Thereby, the pedestrian behavior execution unit 50 performs simulation of the behavior of an agent based on the recognized information limited by the simulation management unit 30.

The simulation management unit 30 outputs the sequential simulation result (the location information of the agent and the recognition information of the agent) of the behavior of the agent performed by the pedestrian behavior execution unit 50 to the simulation result output unit 60.

The sign system change unit 40 changes the sign system plan 12 and the pedestrian information 13 that are stored in the input information storage unit 20 based on the operation instruction received from a user by an input device, for example, a mouse, a keyboard, or the like. Thereby, it is possible for the user to suitably change the sign system plan 12 and the pedestrian information 13.

The pedestrian behavior execution unit 50 performs sequential simulation of the behavior of an agent using the input information (the spatial information 11, the sign system plan 12 and the pedestrian information 13) as initial conditions. Specifically, the pedestrian behavior execution unit 50 performs sequential simulation of the behavior of an agent at next time based on the simulation result (the location information of the agent and the recognition information of the agent) of the behavior of the agent up to the previous time. The pedestrian behavior execution unit 50 outputs the result of the sequential simulation to the simulation management unit 30. That is to say, the pedestrian behavior execution unit 50 is an example of the behavior execution unit that performs simulation of the behavior in the virtual space, which is based on the recognition information that the agent obtained under the influence of each of the plurality of signs disposed in the virtual space.

The simulation result output unit 60 stores the sequential simulation result (the location information of the agent and the recognition information of the agent) of the behavior of the agent in the agent information storage unit 70. The simulation result output unit 60 outputs the simulation result stored in the agent information storage unit 70 by displaying the simulation result on a display device or by printing the simulation result on a printer. The outputting the simulation result may be performed by sequentially outputting the sequential simulation result. Alternatively, the total result of the simulation performed for a predetermined time period may be output.

The agent information storage unit 70 stores the simulation result, such as the information (the location information and the recognition information) of the agent, which is the result of the sequential simulation, and the like in a storage device, such as a RAM, an HDD, or the like.

Figure 5:
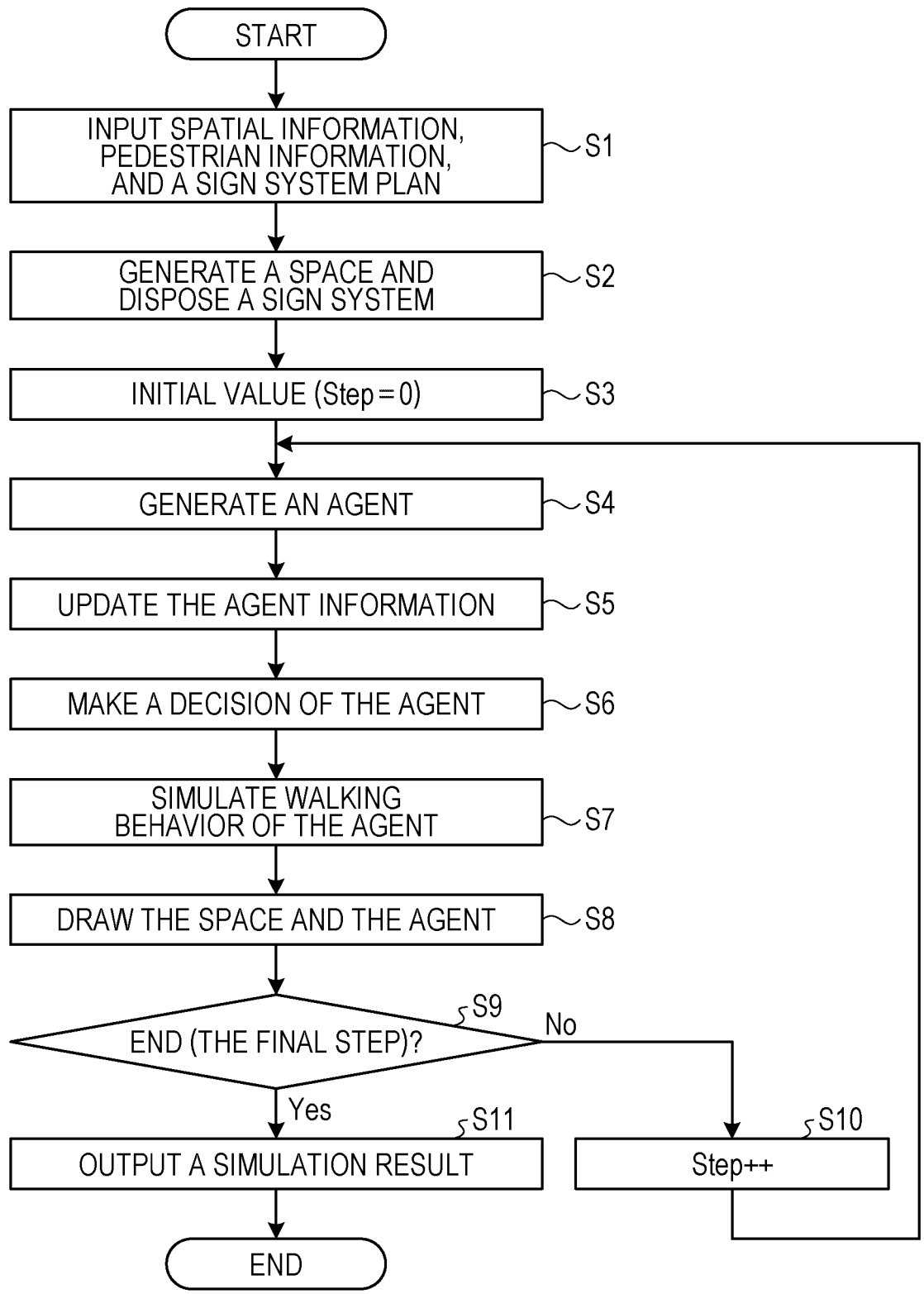
FIG. 5 is a flowchart illustrating an example of the operation of the simulation apparatus.

Next, a detailed description will be given of the operation of the simulation apparatus 1. FIG. 5 is a flowchart illustrating an example of the operation of the simulation apparatus.

As illustrated in FIG. 5, when the processing is started, the input unit 10 receives input of the spatial information 11, the pedestrian information 13, and the sign system plan 12 and stores these pieces of information in the input information storage unit 20 (S1). Next, the simulation management unit 30 generates a virtual space and disposes a sign system in the virtual space based on the input spatial information 11 and sign system plan 12 (S2).

Figure 6:
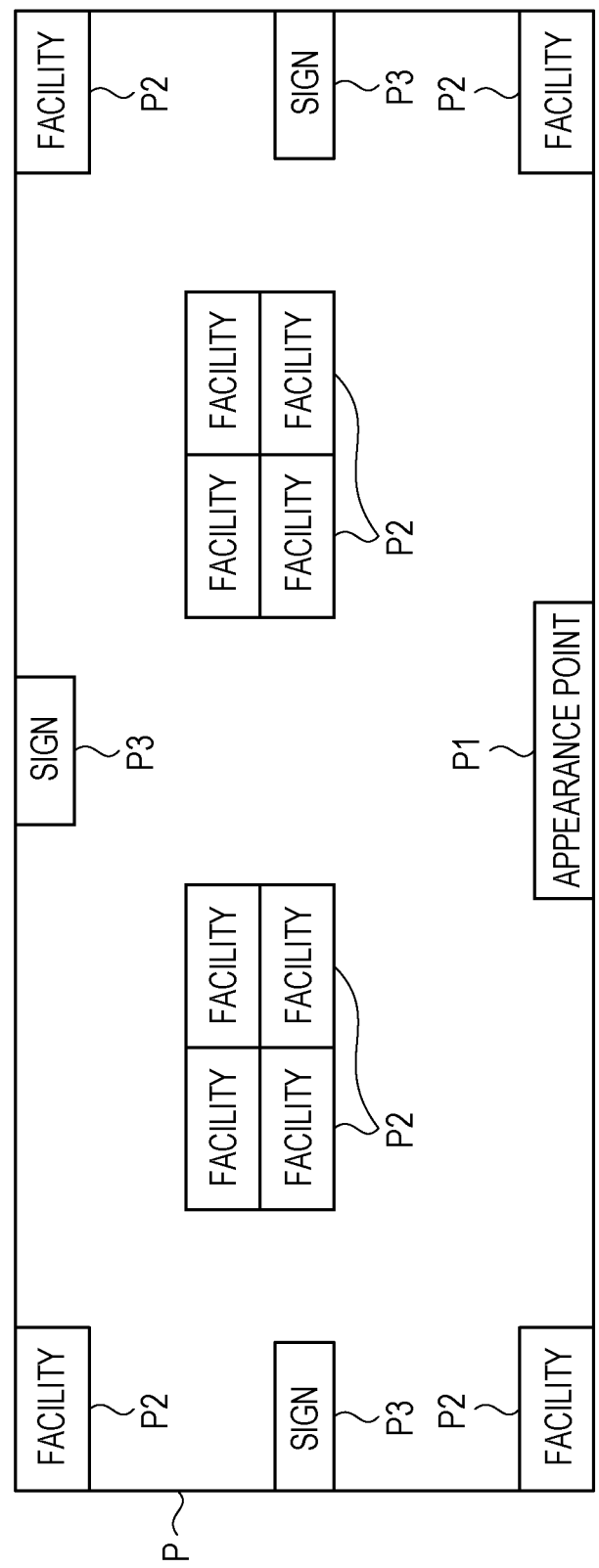
FIG. 6 is an explanatory diagram of a virtual space.

FIG. 6 is an explanatory diagram of a virtual space. As illustrated in FIG. 6, the simulation management unit 30 generates a virtual space P based on the cell environment (the dimensions of the space, the number of floors, and the locations of walls) of the spatial information 11. The simulation management unit 30 disposes an appearance point P1, facilities P2, and the like in the virtual space P based on the network environment (the locations of nodes, types, and the connection relationships between the nodes) of the spatial information 11. The simulation management unit 30 disposes signs P3 in the virtual space P based on the locations of the sign system plan 12.

Figure 7:
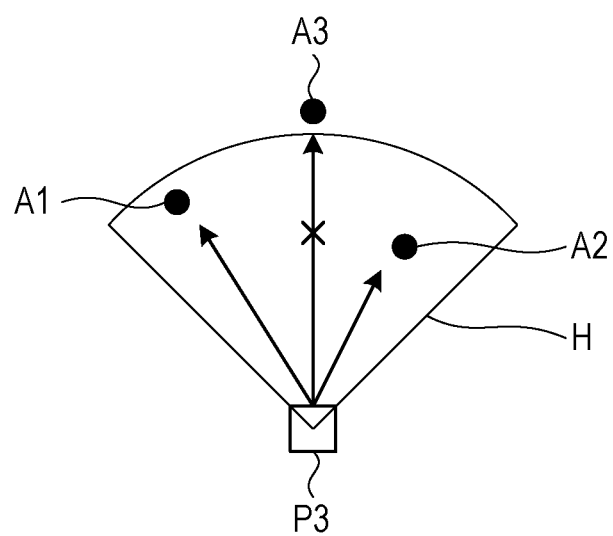
FIG. 7 is an explanatory diagram of a reaching range of guidance information.

FIG. 7 is an explanatory diagram of a reaching range of the guidance information by a sign P3. As illustrated in FIG. 7, a reaching range H corresponding to a transmission rate, a distance, and an angle in the sign system plan 12 is set in the sign P3 disposed in the virtual space P. Accordingly, it is assumed that agents A1 and A2 located in the reaching range H are capable of obtaining (recognizing) the guidance information from the sign P3, and an agent A3 located outside the reaching range H is not capable of obtaining (recognizing) the guidance information from the sign P3.

Next, the simulation management unit 30 sets an initial value (step=0) in the number of steps corresponding to the start time of the simulation (S3). After that, when the simulation management unit 30 repeats the processing of S4 to S10, the simulation management unit 30 advances the clock of the simulation by incrementing the set step. Thereby, the simulation management unit 30 causes the pedestrian behavior execution unit 50 to perform the simulation for each time to proceed in accordance with the steps in the processing from S4 to S10. The time width of the simulation that progresses by incrementing the step may be set to any width, and the user sets in advance the time width in units of, for example, a few seconds to a few tens of seconds.

Next, the simulation management unit 30 generates an agent at the appearance point P1 based on the occurrence probability in the pedestrian information 13 and the occurrence rate for each pedestrian type (S4). Specifically, the simulation management unit 30 verifies the presence or absence of generation of an agent at the set occurrence probability and occurrence rate based on a generated random number. The simulation management unit 30 generates an agent of the type having the presence of generation based on the verification result. The simulation management unit 30 assigns identification information, such as identification data (ID), and the like for each generated agent and stores the location of the agent and the recognition information in the agent information storage unit 70.

Figure 8:
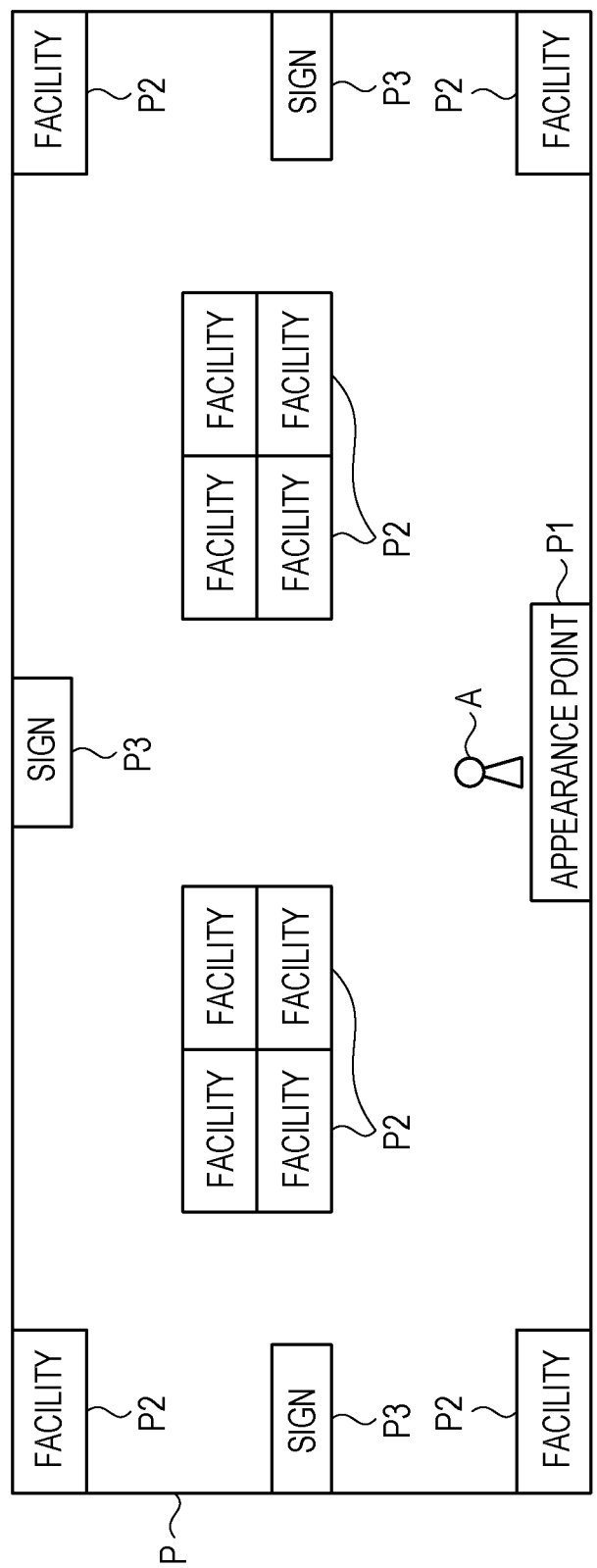
FIG. 8 is an explanatory diagram of the generation of an agent.

FIG. 8 is an explanatory diagram of generation of an agent. As illustrated in FIG. 8, an agent A of the type having the presence of generation is generated at the appearance point P1 based on the occurrence rate for each occurrence probability and pedestrian type. For example, if the occurrence probability is 0.8, the agent A is generated with a probability of 0.8 in one step.

Figure 9:
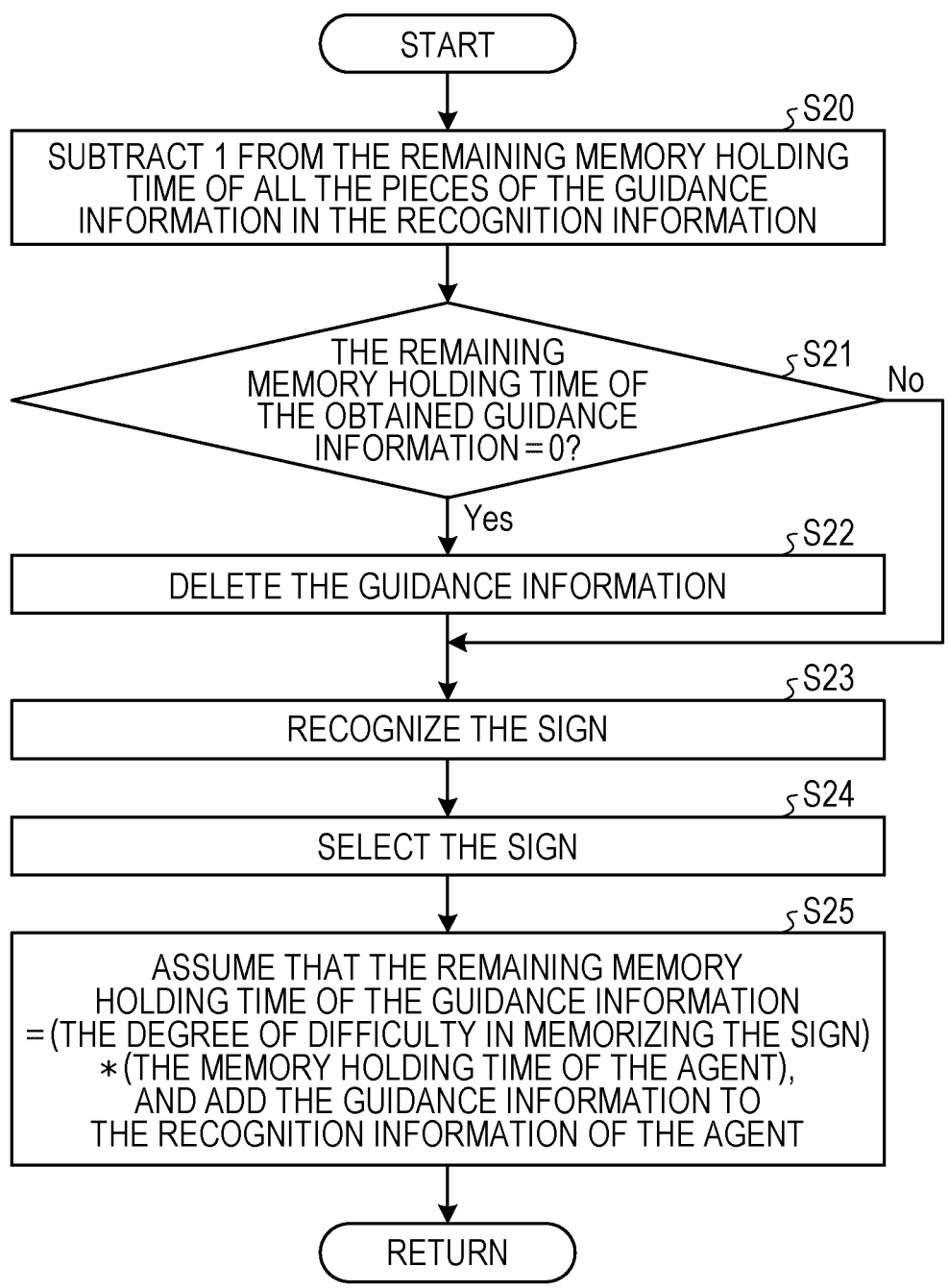
FIG. 9 is a flowchart illustrating an example of update processing of the recognition information of the agent.

Next, the simulation management unit 30 performs update processing that reads the recognition information of each agent A generated in the virtual space P from the agent information storage unit 70 and updates the recognition information (S5). FIG. 9 is a flowchart illustrating an example of the update processing of the recognition information on the agent A. Although FIG. 9 illustrates an example of the update processing for one agent A, the simulation management unit 30 performs the update processing in FIG. 9 on all the agents A generated in the virtual space P.

As illustrated in FIG. 9, when the update processing is started, the simulation management unit 30 refers to the recognition information of the agent A stored in the agent information storage unit 70 and subtracts 1 from the remaining memory holding time set in all pieces of the guidance information (the guidance information deemed to be the recognition information) in the recognition information of the agent A (S20). By the processing in S20, the remaining memory holding time set in the guidance information is reduced with the lapse of time of the simulation.

Next, the simulation management unit 30 determines whether or not the remaining memory holding time=0 of the obtained guidance information (S21). If the remaining memory holding time=0 (S21: YES), the simulation management unit 30 deletes the guidance information having the remaining memory holding time=0 from the recognition information (S22), and processing proceeds to S23. If the remaining memory holding time=0 does not hold (S21: NO), the simulation management unit 30 does not delete the guidance information from the recognition information, and the processing proceeds to S23.

Thereby, while the remaining memory holding time has not been reduced to 0, the recognized guidance information is used for the simulation of the agent A. When the remaining memory holding time has been reduced to 0 with the lapse of time of the simulation, the recognized guidance information is deleted, and use of the recognized guidance information for the simulation is limited.

Next, the simulation management unit 30 refers to the location information of the agent A stored in the agent information storage unit 70 and the information related to the reaching range H, such as the location of the sign P3, the transmission rate, the distance, the angle, and the like in the sign system plan 12 and confirms the recognition of the sign P3 by the agent A (S23). Specifically, as illustrated in FIG. 7, if the agent A is located within the reaching range H of the sign P3, it is assumed that the sign P3 is recognized.

Next, the simulation management unit 30 selects a sign P3 to be stored as recognition information from the signs P3 recognized by the agent A in accordance with the attributes related to the display mode of the signs P3 and the attributes (the degree of influence on the display mode) of the agent A (S24).

Specifically, the simulation management unit 30 obtains the degree (attraction degree $U_{in}$) to which a sign P3($i$) attracts an agent A(n) by the following expression (1). In the expression (1), $\beta_{1n}$, $\beta_{2n}$, and $\beta_{3n}$ are the degrees of influence ($\beta1$ to $\beta3$) on the agent A(n), and $x_{1i}$, $x_{2i}$, and $x_{3i}$ are the attribute values (x1 to x3) of the display mode of the sign P3($i$).

$$U_{in}=\beta_{1n}x_{1i}+\beta_{2n}x_{2i}\beta_{3n}x_{3i} \quad (1)$$

Next, the simulation management unit 30 obtains the selection probability ($P_{in}$) of the agent A(n) to select the sign P3($i$) based on the attraction degree $U_{in}$ obtained for each sign P3($i$) by the following expression (2). Reference sign j=1 ... J denotes each sign P3 recognized by the agent A. The simulation management unit 30 selects a sign P3 to be stored as recognition information based on the selection probability $P_{in}$ obtained for each sign P3($i$) for the agent A.

$$P_{in} = \frac{\exp(U_{in})}{\sum_{j=1}^{J} \exp(U_{jn})} \quad (2)$$

It is assumed that each of the attribute values ($x_{1i}$, $x_{2i}$, $x_{3i}$) of the display mode at the time of obtaining the attraction degree $U_{in}$ is less than or equal to a predetermined limit values ($C_{1i}$, $C_{2i}$, $C_{3i}$) as expressed in the following expression (3).

$$x_{1i} \le C_{1i}, x_{2i} \le C_{2i}, x_{3i} \le C_{3i} \quad (3)$$

For example, the display mode of the sign P3 has a certain limitation by the limitation of the display area, the set location, and the like. Accordingly, as illustrated by the expression (3), each of the attribute values ($x_{1i}$, $x_{2i}$, $x_{3i}$) of the display mode is subjected to a certain limitation.

It is assumed that the total value ($x_{1i}+x_{2i}+x_{3i}$) of the individual attribute values of the display mode of the sign P3($i$) is less than or equal to a predetermined limit value ($C_i$) as illustrated by the expression (4). The limit value $C_i$ is set in accordance with the display area of the sign P3($i$), and the like.

$$x_{1i}+x_{2i}+x_{3i} \le C_i \quad (4)$$

For example, a sign P3 provides various kinds of information under the constraint of the limited display area, and the like. Accordingly, a trade-off relationship is established. For example, if the size of character is increased, the information quantity to be described is reduced, and if a drawing is included, the size of character or the information quantity to be described is reduced, and the like. Accordingly, as illustrated by the expression (4), it is possible to reproduce the above-described trade-off relationship by setting the total value of the individual attribute values of the display mode of the sign P3($i$) to a limit value $C_i$.

The simulation management unit 30 may obtain the attraction degree $U_{in}$ described above in accordance with the location relationship (the distance, or the like) between the sign P3($i$) and the agent A(n) as described in the following (5). Reference sign $\beta_{dn}$ is an attribute value indicating the degree of influence of the location relationship (distance) of the agent A(n) with respect to the sign P3. Reference sign $d_{in}$ denotes the distance value of the agent A(n) from the sign P3($i$).

$$U_{in}=\beta_{1n}x_{1i}+\beta_{2n}x_{2i}\beta_{3n}x_{3i}\beta_{dn}d_{in} \quad (5)$$

Next, the simulation management unit 30 stores the information of the selected sign P3 in the agent information storage unit 70 as the recognition information recognized by the agent A. Specifically, the simulation management unit 30 calculates the remaining memory holding time=(the difficulty degree in memorizing of the sign P3)*(the memory holding time of the agent A) for the guidance information of the selected sign P3. The simulation management unit 30 adds the guidance information to the recognition information of the agent A together with the remaining memory holding time (S25).

In this manner, in S25, the simulation management unit 30 sets the remaining memory holding time as an initial value related to the limitation of the guidance information when the agent A recognized the guidance information. For example, for the guidance information of which the difficulty degree in memorizing set in the sign P3 is high and which is difficult to be forgot, the remaining memory holding time is set to a high value. For the agent A that has a long memory holding time and remembers the recognized guidance information long, the remaining memory holding time is set to a high value. The remaining memory holding time may be set based on both the difficulty degree in memorizing of the sign P3 and the memory holding time of the agent A, or may be set based on either one of them.

In above-described update processing of the recognition information, an example has been described in accordance with the step flow (the lapse of time of the simulation). However, as long as the processing is performed in accordance with the progress of the simulation, the processing is not limited to have time limitation. For example, the recognition information may be limited based on the progress of the behavior of the agent A, such as the number of steps of the agent A with the progress of the simulation, the number of changing directions, and the like. For example, the number of steps of the agent A with the progress of the simulation or the number of changing directions may be counted in the same manner as the remaining memory holding time, and if the counted value becomes equal to or higher than a predetermined value, the recognized guidance information may be deleted. In this manner, by imposing a limitation not only on the lapse of time of the simulation, but on the recognition information based on the behavior of the agent A, it is possible to realize realistic simulation based on the behavior of the agent A.

Figure 10:
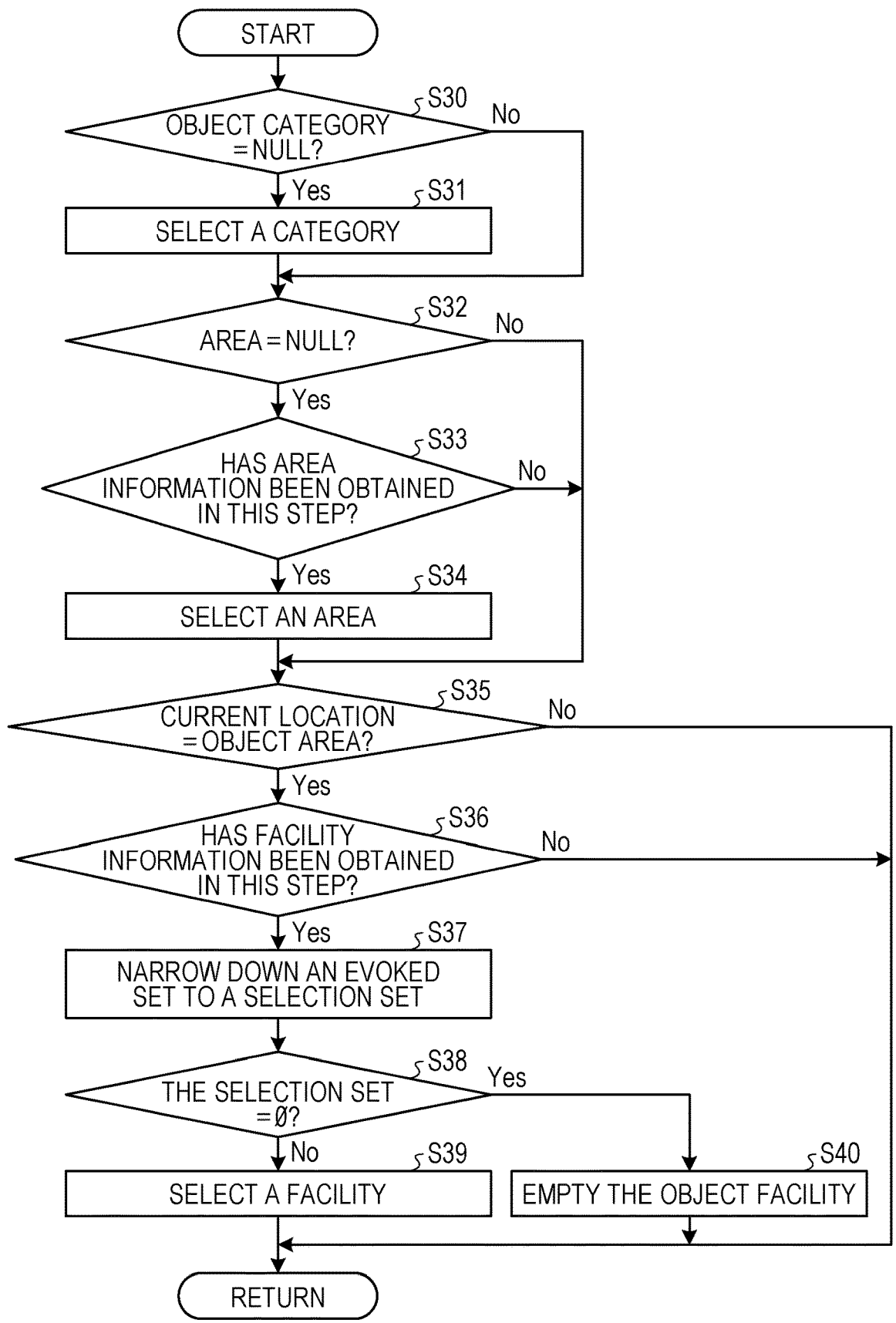
FIG. 10 is a flowchart illustrating an example of decision making processing of the agent.

Referring back to FIG. 5, next to S5, the simulation management unit 30 makes a decision of each agent A generated in the virtual space P based on the pedestrian information 13 and the recognition information (S6). FIG. 10 is a flowchart illustrating an example of decision making processing of the agent A. Although FIG. 10 illustrates an example of the decision making processing for one person, the simulation management unit 30 performs the processing illustrated in FIG. 10 for all the agents A set in the virtual space P.

As illustrated in FIG. 10, when the processing is started, the simulation management unit 30 determines whether or not the object category of the agent A=0, that is to say, whether or not an object category has been selected (S30). If an object category has not been selected, and thus object category=0 (S30: YES), the simulation management unit 30 selects one category from the object category of the pedestrian information 13 (S31).

If an object category has been selected, and thus if the object category≠0 (S30: NO), the simulation management unit 30 determines that the object category has been selected and the processing proceeds to S32.

Next, the simulation management unit 30 determines whether or not the target area of the agent A=0, that is to say, determines whether or not an area corresponding to the selected category among the object category has been selected (S32).

If a target area has not been selected (S32: YES), the simulation management unit 30 determines whether or not the area information (the guidance information to the area) of the area corresponding to the selected category among the object category has been obtained (recognized) in this step (S33). Specifically, the simulation management unit 30 refers to the recognition information in this step and determines whether or not the guidance information of the object area corresponding to the selected category is included in the recognition information.

If the area information (guidance information) of the target area of the agent A has been obtained (recognized) (S33: YES), the simulation management unit 30 selects the obtained area (S34). Thereby, the behavior to the area whose guidance information has been recognized by the agent A is determined. If the target area has been selected (S32: NO) and if the agent A has not recognized the guidance information of the target area (S33: NO), the simulation management unit 30 skips the processing of S34, and the processing proceeds to S35.

Next, the simulation management unit 30 determines whether or not the current location of the agent A is in the selected object area among the object category (S35). If the current location=the object area (S35: YES), the simulation management unit 30 determines whether or not the facility information (the guidance information to the facility) has been obtained (recognized) in this step (S36). Specifically, the simulation management unit 30 refers to the recognition information in this step and determines whether or not the guidance information on the facility in the object area which is the current location is included in the recognition information.

If the agent A has obtained (recognized) the guidance information to the facility (S36: YES), the simulation management unit 30 narrows down the evoked set to a selection set (S37). Specifically, the simulation management unit 30 narrows down the choices from the facilities (evoked set) recognized by the agent A to the selection set by the object and the state of the agent A. For example, the simulation management unit 30 cuts off the facilities having a time period until the end of using the facility higher than a predetermined threshold value among the evoked set so as to narrow down to a selection set. As an example, the facilities are narrowed down to have (the estimated traveling time to the facility)+(waiting time)+(use time)<a threshold value.

Next, the simulation management unit 30 determines whether or not the selection set=0 (S38). If the selection set≠0 (S38: NO), the simulation management unit 30 selects a facility from the selection set (S39). If the selection set=0 (S38: YES), the simulation management unit 30 empties the facility that is targeted by the agent A (S40).

The selection of a facility from the selection set is made using a publicly known method, such as a discrete choice model, or the like. For example, $P(i)=((\text{facility } i) \text{ included in the selection set}) \times \exp U(i)/\Sigma \exp U(n)$ is calculated, and the facility having a high value is selected. In the above, $U(i)=$(the usefulness value of the facility $i$)$+\beta1 \cdot$(the estimated traveling time to the facility $i$)$+\beta2 \cdot$(the waiting time of the facility $i$), and $\beta1$ and $\beta2$ are weighted values set in advance.

Referring back to FIG. 5, the pedestrian behavior execution unit 50 simulates the walking behavior of each agent A based on the recognition information updated in S5 and the decision made in S6 for each agent A (S7). Specifically, the pedestrian behavior execution unit 50 calculates the direction of walking and the amount of walking in the step in accordance with the recognition information recognized by each agent A and the decisions made. The simulation result in S7 is output to the simulation management unit 30 and is stored in the agent information storage unit 70.

If the recognition information recognized by each agent A is limited, or the target area has not been determined, the surrounding waypoints are randomly selected, and walking (the direction and the amount of walking) aiming to the selected waypoint is calculated. Thereby, it is possible to reproduce a behavior that has lost the relationship between a destination and the own location, such as "wander around", "lose one's way", which is the realistic movement of a person, and the like.

Next, the simulation result output unit 60 draws the virtual space P and each agent A in the virtual space P on the screen of the display device based on the simulation result stored in the agent information storage unit 70 (S8).

Next, the simulation management unit 30 determines whether or not the processing up to the final step (time to end the simulation) set in advance has been terminated (S9). If the processing has not been terminated (S9: NO), the simulation management unit 30 increments the number of steps (S10), and the processing returns to S4.

If the processing has been terminated (S9: YES), the simulation result output unit 60 outputs the total result of the simulation results of the agent information storage unit 70, for example, on the screen of the display device (S11). Thereby, it is possible for the user to easily recognize the total result of the simulation.

For example, the simulation management unit 30 determines the influence of each of the plurality of signs P3 in the virtual space P on the agent A in accordance with the plurality of display attributes related to the display mode of the sign P3 and the attributes (degree of influence) of the agent A. The pedestrian behavior execution unit 50 simulates the behavior of the agent A in the virtual space P under the influence of a plurality of signs P3 disposed in the virtual space P. Accordingly, in the total result by the simulation described above, it is possible to reproduce the display mode of the sign P3 and the preference of the agent A to the display mode regarding the influence of the individual signs P3 on the agent A.

A description will be given of a study example of the sign system plan 12 by the people flow simulation by illustrating a specific case. FIG. 11 is an explanatory diagram of the attribute values of the agent A and information obtainable signs.

As illustrated in FIG. 11, it is assumed that the agent A is divided into three groups, "agentA", "agentB", and "agentC". For each group, it is assumed that the degree of influence (β1, β2, β3) on "agentA" is "3, 0, −1". It is assumed that the degree of influence (β1, β2, β3) on "agent B" is "1, 3, 1". It is assumed that the degree of influence (β1, β2, β3) on "agent C" is "2, 1, 2".

It is assumed that each of "agentA", "agentB", and "agentC" is capable of obtaining the guidance information for realizing a goal from the sign P3 marked with a circle among the signs P3 of "sign1", "sign2", and "sign3". For example, it is possible for "agent A" and "agent B" to head for the target facility from the guidance information of "sign1". It is possible for "agent C" to head for the target facility from the guidance information of "sign2" or "sign3".

Figure 12:
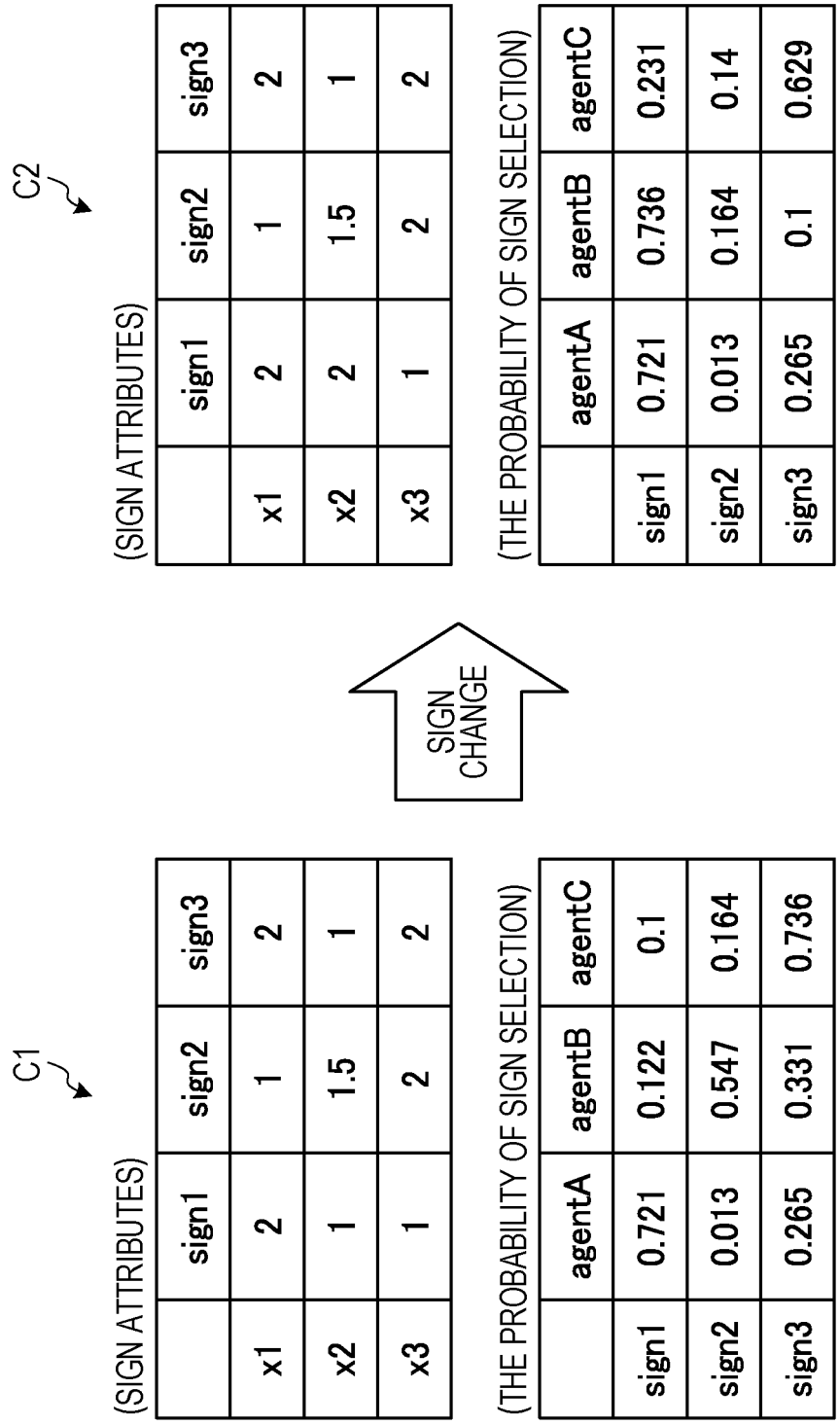
FIG. 12 is an explanatory diagram of sign selection by the agents.

FIG. 12 is an explanatory diagram of sign selection by the agents A. As illustrated in FIG. 12, in case C1, it is assumed that the display attributes (x1, x2, x3) of "sign1" is set to "2, 1, 1" for the signs P3 of "sign1", "sign2", and "sign3". It is assumed that the display attributes (x1, x2, x3) of "sign2" is set to "1, 1.5, 2". It is assumed that the display attributes (x1, x2, x3) of "sign3" is set to "2, 1, 2".

In such case C1, "agent B" is attracted by "sign2" having the highest selection probability of "0.547" and is not headed for the target facility, which causes misguidance. Accordingly, the group "agent B" of the agent A reproduces useless movement, for example, "agent B" totters, or the like in the people flow simulation.

Based on such a result of the people flow simulation, the user changes a sign in the sign system plan 12. Specifically, the user adjusts the attributes of the display mode so that "agentB" is attracted by "sign1" to correctly head for the target facility. More specifically, the display attribute (x1, x2, x3) of "sign1" is changed from "2, 1, 1" to "2, 2, 1" so that "agentB" is attracted by "sign1".

Figure 13:
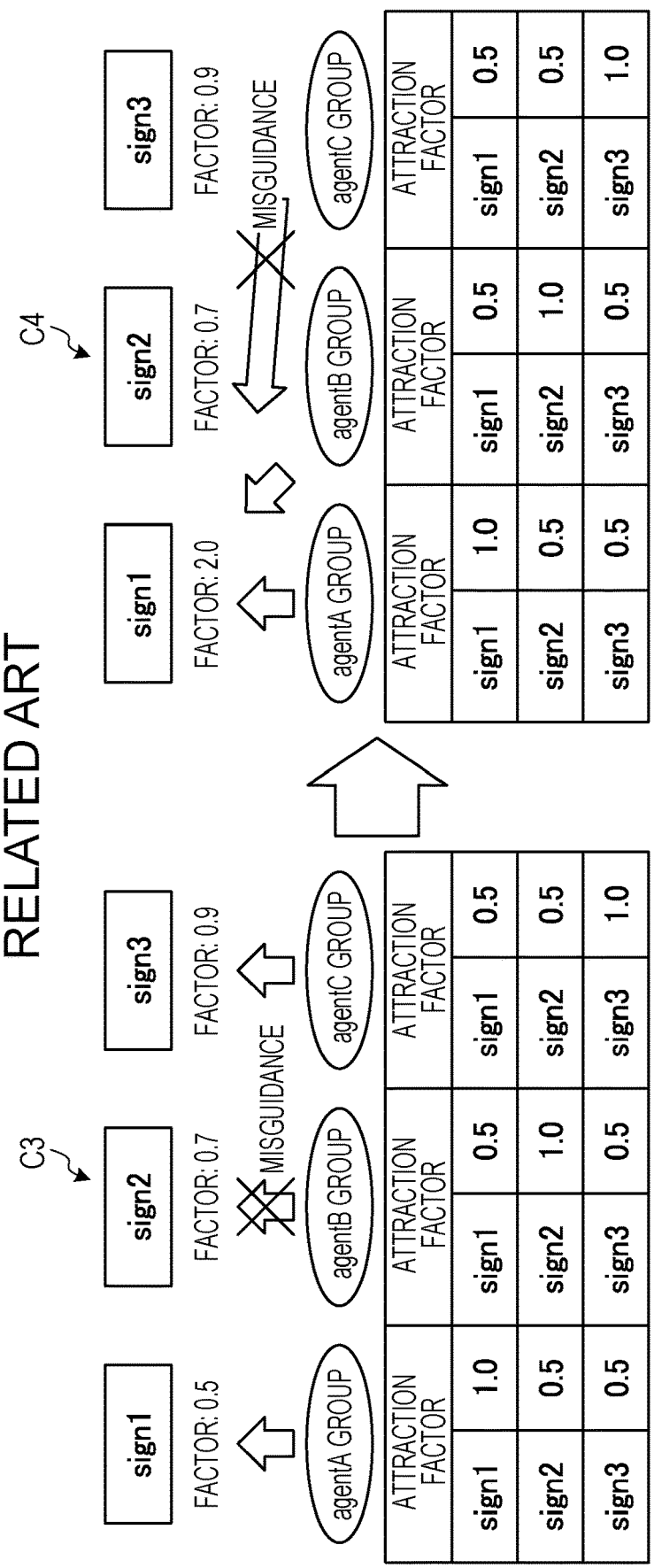
FIG. 13 is an explanation diagram of evaluation of a sign system plan in the related-art simulation.

FIG. 13 is an explanation diagram of evaluation of a sign system plan in the related-art simulation. As illustrated in FIG. 13, in the related-art simulation, when "agentB" is misguided by "sign2" as illustrated in case C3, if "sign1" is adjusted as illustrated in case C4, all of the agent A is attracted in the same way. Accordingly, "agentC" is sometimes misguided as illustrated in case C4. In this manner, in the related-art simulation, it is difficult to evaluate the sign system plan from the viewpoint of the display mode of the sign P3, and thus it is difficult to design a sign system plan with high precision.

Figure 14:
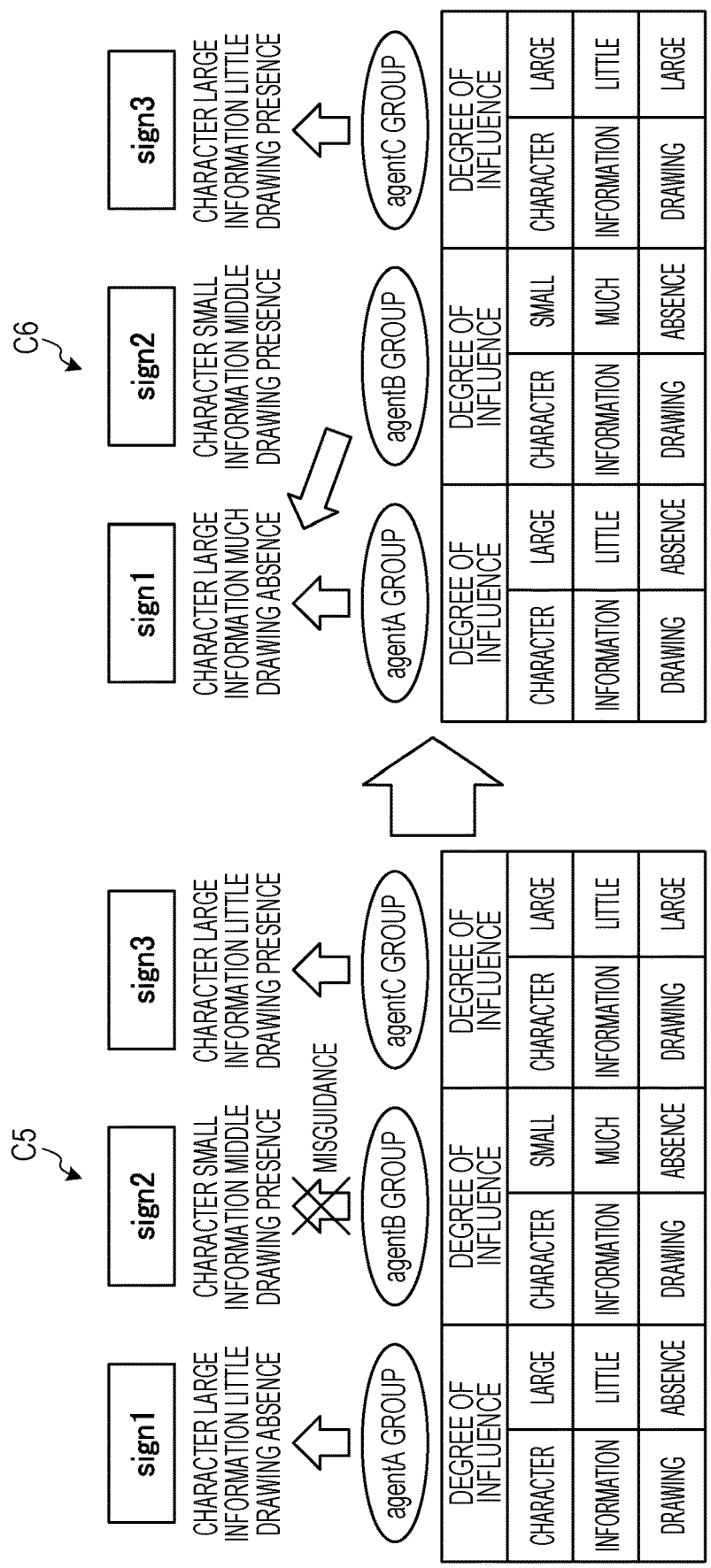
FIG. 14 is an explanation diagram of evaluation of a sign system plan in a simulation according to the embodiment.

FIG. 14 is an explanation diagram of evaluation of a sign system plan 12 in a simulation according to the embodiment. As illustrated in FIG. 14, in a simulation according to the embodiment, when "agentB" is misguided by "sign2" as illustrated in case C5, it is possible to adjust the display attribute of the sign P3 by changing the display attribute of the sign P3 and the attribute (degree of influence) of the agent A. For example, the attribute related to the information quantity of "sign1" is changed so that "agentB" is attracted by "sign1" and not attracted by "sign2" as illustrated in case C6. In this manner, in the simulation according to the embodiment, it is possible to evaluate and change the sign system plan 12 from the viewpoint of the display mode of the sign P3, and thus to design the sign system plan 12 with high precision.

As described above, the simulation apparatus 1 that simulates the behavior of a person using the agent A disposed in the virtual space P has the pedestrian behavior execution unit 50 and the simulation management unit 30. The pedestrian behavior execution unit 50 performs simulation in which the agent A behaves in the virtual space P under the influence of each of the plurality of signs P3 disposed in the virtual space P. The simulation management unit 30 determines the influence of each of the plurality of signs P3 in the virtual space P on the agent A in accordance with a plurality of display attributes related to the display mode of the sign P3 and the attributes (the degree of influence) of the agent A. Thereby, in the people flow simulation according to the simulation apparatus 1, it is possible to reliably reproduce the display mode of the sign P3 and the preference of the agent A to the display mode regarding the influence of the individual signs P3 on the agent A. Accordingly, it becomes possible for the simulation apparatus 1 to evaluate the display mode of the sign P3 in the people flow simulation.

The sign P3 includes a plurality of attributes related to the display mode (for example, the size of character (x1), information quantity (x2), the presence or absence of drawings (x3) . . . ). The simulation management unit 30 determines the influence in accordance with the degree of attracting the agent A (attraction degree) by the sign P3 based on each of the plurality of attributes related to the display mode of the sign P3 and the degrees of influence ($\beta_1$, $\beta_2$, $\beta_3$ . . . ) on the agent A corresponding to the attributes. Thereby, it is possible for the simulation apparatus 1 to evaluate various display modes, such as the size of character (x1), information quantity (x2), the presence or absence of drawings (x3) . . . , and the like.

The attribute values (for example, the size of character (x1), information quantity (x2), the presence or absence of drawings (x3), . . . ) of each of the plurality of attributes related to the display mode of the sign P3 has a certain limitation as illustrated by the expression (3). For example, the display mode of the sign P3 may have limitations on the size of character, describable information quantity, the presence or absence of drawings, and the like by the conditions, such as, the display area and the set location of the sign P3, and the like. Accordingly, as illustrated by the expression (3), it is possible to reproduce the above-described limitations on the sign P3 by disposing certain limitations on the attribute values of the plurality of attributes related to the display mode.

The total value of the attribute values (for example, the size of character (x1), information quantity (x2), the presence or absence of drawings (x3) . . . ) of the individual plurality of attributes related to the display mode of the sign P3 is less than or equal to a predetermined limit value ($C_i$) as illustrated by the expression (4). For example, the sign P3 provides various kinds of information under the constraint, such as a limited display area, and the like. Accordingly, a trade-off relationship is established within a limit value corresponding to the display area, and the like in each attribute value of the plurality of attributes related to the display mode. For example, if the size of character is increased, the information quantity to be described is reduced. Accordingly, as illustrated by the expression (4), the total value of the individual attribute values of the plurality of attributes related to the display mode is kept within a predetermined limit value so that it is possible to reproduce the state of providing information by changing the display mode under the restrictions of the limited display area, and the like.

All of or any part of the various processing functions performed by the simulation apparatus 1 may be executed on a CPU (or a microcomputer, such as an MPU, a micro controller unit (MCU), or the like). It goes without saying that all of or any part of the various processing functions may be performed by programs that are analyzed and executed on a CPU (or a microcomputer, such as an MPU, an MCU, or the like) or by hardware of wired logic. The various processing functions performed by the simulation apparatus 1 may be executed by a combination of a plurality of computers using cloud computing.

In the present embodiment, the case of pedestrian agents that simulated pedestrians are illustrated. However, the type of the agent is not limited to a human being. For example, animals having different reactions to a sign, such as feed, and the like depending on individuals may be simulated as agents.

Figure 15:
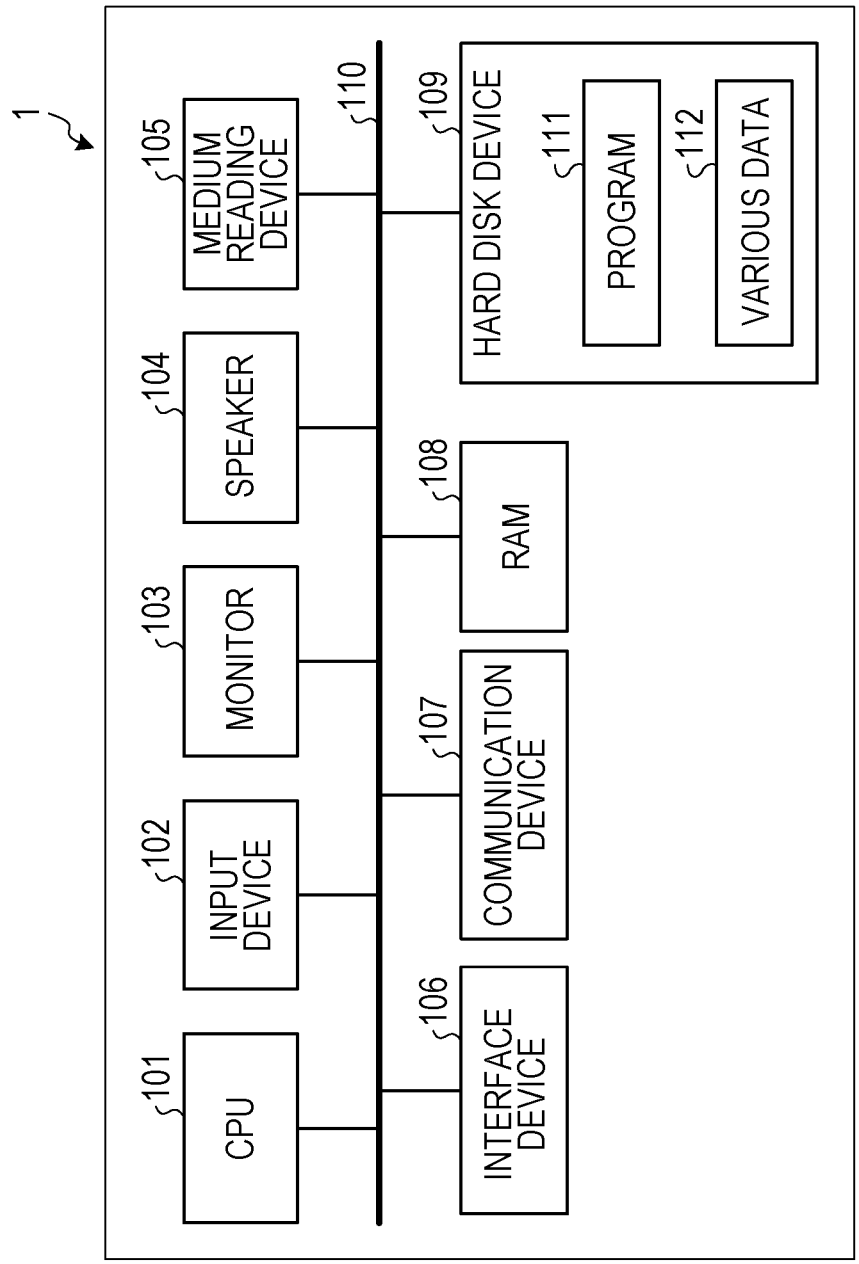
FIG. 15 is a block diagram illustrating an example of the hardware configuration of a simulation apparatus according to the embodiment.

Incidentally, it is possible to realize the various kinds of processing described in the embodiment described above by executing a program provided in advance by a computer. Thus, in the following, a description will be given of an example of a computer (hardware) that executes a program having the same functions as those of the embodiment described above. FIG. 15 is a block diagram illustrating an example of the hardware configuration of the simulation apparatus 1 according to the embodiment.

As illustrated in FIG. 15, the simulation apparatus 1 includes a CPU 101 that executes various kinds of operation processing, an input device 102 that receives data input, a monitor 103, and a speaker 104. The simulation apparatus 1 includes a medium reading device 105 that reads a program, and the like from a storage medium, an interface device 106 for connecting with various devices, and a communication device 107 that performs communication connection with the external devices in a wired or wireless manner. The simulation apparatus 1 includes a RAM 108 and a hard disk device 109, in which various kinds of information is temporarily stored. Each unit (101 to 109) in the simulation apparatus 1 is connected to a bus 110.

The hard disk device 109 stores a program 111 for performing various kinds of processing related to the input unit 10, the input information storage unit 20, the simulation management unit 30, the sign system change unit 40, the pedestrian behavior execution unit 50, the simulation result output unit 60, and the agent information storage unit 70 described in the embodiments described above. The hard disk device 109 stores various data 112 referenced by the program 111. The input device 102 receives input of operation information from, for example, an operator of the simulation apparatus 1. The monitor 103 displays, for example, various screens to be operated by an operator. The interface device 106 is connected to, for example, a printer, and the like. The communication device 107 is connected to a communication network, such as a local area network (LAN), or the like and exchanges various kinds of information with an external device via the communication network.

The CPU 101 reads the program 111 stored in the hard disk device 109 and loads the program 111 in the RAM 108 so as to perform various kinds of processing related to the input unit 10, the input information storage unit 20, the simulation management unit 30, the sign system change unit 40, the pedestrian behavior execution unit 50, the simulation result output unit 60, and the agent information storage unit 70. The program 111 may not be stored in the hard disk device 109. For example, the simulation apparatus 1 may read the program 111 stored in a storage medium readable by the simulation apparatus 1 and execute the program 111. The storage medium readable by the simulation apparatus 1 corresponds to a portable recording medium, for example, a CD-ROM, a DVD disc, a Universal Serial Bus (USB) memory, or the like, a semiconductor memory, such as a flash memory, or the like, a hard disk drive, or the like. The program 111 may be stored in a device connected to a public line, the Internet, a LAN, or the like, and the simulation apparatus 1 may read the program from the device and execute the program.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a simulation program using an agent disposed in a virtual space for causing a computer to execute a process comprising:
   controlling the agent so that the agent behaves in the virtual space under influence of each of a plurality of signs disposed in the virtual space;
   determining the influence of each of the plurality of signs on the agent in accordance with an attribute relating to a display mode of the sign and an attribute of the agent; and
   drawing the agent in the virtual space on a display device based on a result of the controlling,
   the sign includes a plurality of attributes relating to the display mode, and
   the determining determines the influence in accordance with a degree of attracting attention of the agent by the sign based on each of the plurality of attributes relating to the display mode of the sign and an attribute of the agent corresponding to each of the attributes relating to the display mode.

2. The computer-readable recording medium according to claim 1, wherein an attribute value of each of the plurality of attributes relating to the display mode of the sign has a predetermined limit.

3. The computer-readable recording medium according to claim 1, wherein a total value of individual attribute values of the plurality of attributes relating to the display mode of the sign is less than or equal to a predetermined limit value.

4. The computer-readable recording medium according to claim 1, wherein the attribute of the agent is an attribute indicating preference of the agent to the sign.

5. A simulation method performed by a computer using an agent disposed in a virtual space, the method comprising:
controlling the agent so that the agent behaves in the virtual space under influence of each of a plurality of signs disposed in the virtual space; and
determining the influence of each of the plurality of signs on the agent in accordance with an attribute relating to a display mode of the sign and an attribute of the agent; and
drawing the agent in the virtual space on a display device based on a result of the controlling,
the sign includes a plurality of attributes relating to the display mode, and
the determining determines the influence in accordance with a degree of attracting attention of the agent by the sign based on each of the plurality of attributes relating to the display mode of the sign and an attribute of the agent corresponding to each of the attributes relating to the display mode.

6. The simulation method according to claim 5, wherein an attribute value of each of the plurality of attributes relating to the display mode of the sign has a predetermined limit.

7. The simulation method according to claim 5, wherein a total value of individual attribute values of the plurality of attributes relating to the display mode of the sign is less than or equal to a predetermined limit value.

8. The simulation method according to claim 5, wherein the attribute of the agent is an attribute indicating preference of the agent to the sign.

9. A simulation apparatus for simulation using an agent disposed in a virtual space, the apparatus comprising:
a memory, and
a processor coupled to the memory and configured to:
control the agent so that the agent behaves in the virtual space under influence of each of a plurality of signs disposed in the virtual space; and
determine the influence of each of the plurality of signs on the agent in accordance with an attribute relating to a display mode of the sign and an attribute of the agent; and
drawing the agent in the virtual space on a display device based on a result of the controlling,
the sign includes a plurality of attributes relating to the display mode, and
the influence is determined in accordance with a degree of attracting attention of the agent by the sign based on each of the plurality of attributes relating to the display mode of the sign and an attribute of the agent corresponding to each of the attributes relating to the display mode.

10. The simulation apparatus according to claim 9, wherein an attribute value of each of the plurality of attributes relating to the display mode of the sign has a predetermined limit.

11. The simulation apparatus according to claim 9, wherein a total value of individual attribute values of the plurality of attributes relating to the display mode of the sign is less than or equal to a predetermined limit value.

12. The simulation apparatus according to claim 9, wherein the attribute of the agent is an attribute indicating preference of the agent to the sign.

* * * * *